United States Patent

Habeger et al.

[11] Patent Number: 5,800,724
[45] Date of Patent: Sep. 1, 1998

[54] PATTERNED METAL FOIL LAMINATE AND METHOD FOR MAKING SAME

[75] Inventors: Charles C. Habeger, Atlanta, Ga.; Kenneth A. Pollart, Mason, Ohio

[73] Assignee: Fort James Corporation, Richmond, Va.

[21] Appl. No.: 784,287

[22] Filed: Jan. 16, 1997

Related U.S. Application Data

[63] Continuation-in-part of Ser. No. 602,576, Feb. 14, 1996, Pat. No. 5,759,422.

[51] Int. Cl.⁶ .................. B44C 1/22; C23F 1/00
[52] U.S. Cl. .................. 216/35; 216/65; 216/77
[58] Field of Search .................. 216/13, 20, 33, 216/35, 52, 65, 77, 102; 340/572; 219/678, 691, 725, 730, 50

[56] References Cited

U.S. PATENT DOCUMENTS

| | | |
|---|---|---|
| Re. 34,683 | 8/1994 | Maynard et al. . |
| 3,302,632 | 2/1967 | Fichtner . |
| 3,615,713 | 10/1971 | Stevenson . |
| 3,936,626 | 2/1976 | Moore . |
| 4,230,924 | 10/1980 | Brastad et al. . |
| 4,351,997 | 9/1982 | Mattisson et al. . |
| 4,478,677 | 10/1984 | Chen et al. . |
| 4,490,210 | 12/1984 | Chen et al. . |
| 4,490,211 | 12/1984 | Chen et al. . |
| 4,552,614 | 11/1985 | Beckett . |
| 4,835,352 | 5/1989 | Sasaki et al. . |
| 4,835,524 | 5/1989 | Lamond et al. . |
| 4,904,340 | 2/1990 | Miracky et al. . |
| 4,916,285 | 4/1990 | Baur et al. . |
| 5,017,509 | 5/1991 | Tuckerman . |
| 5,117,078 | 5/1992 | Beckett . |
| 5,340,436 | 8/1994 | Beckett . |
| 5,350,904 | 9/1994 | Kemske et al. . |
| 5,370,883 | 12/1994 | Saunier . |
| 5,378,313 | 1/1995 | Pace . |
| 5,494,781 | 2/1996 | Ohtani et al. . |
| 5,525,205 | 6/1996 | Miyashita . |
| 5,534,371 | 7/1996 | Patel et al. . |
| 5,536,605 | 7/1996 | Patel et al. . |
| 5,575,930 | 11/1996 | Tietje-Girault .................. 216/65 |

FOREIGN PATENT DOCUMENTS

86304880.7  6/1986  European Pat. Off. .

*Primary Examiner*—William Powell
*Attorney, Agent, or Firm*—Sixbey, Friedman, Leedom & Ferguson; Charles M. Leedom, Jr.; Donald R. Studebaker

[57] ABSTRACT

A method for making a patterned metal foil/substrate laminate by laminating a sheet of metal foil to a substrate by applying an adhesive between the metal foil and substrate and irradiating the metal foil with a laser beam in a predetermined pattern to vaporize the irradiated portions of the metal foil. Particularly where the laminate is intended for microwave packaging applications, the laminate further includes a sheet of barrier layer material, preferably polymer film, laminated to the patterned metal foil layer. The polymer film layer-containing laminate can be formed into a container for packaging food intended for heating in a microwave oven. A particularly effective pattern comprises a plurality of metal foil islands electrically separated by dielectric substrate gaps. Preferably, the metal foil is aluminum foil, desirably unannealed aluminum foil, and the substrate is selected from paper and coated or uncoated paperboard. The patterned metal foil/substrate laminate is also useful for electrical circuitry, particularly, for example, as the resonant circuit in electronic surveillance tags.

52 Claims, 8 Drawing Sheets

FIG.1
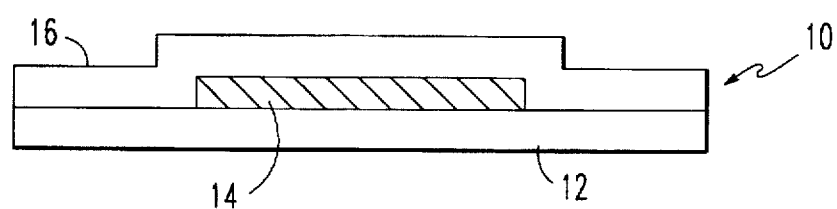
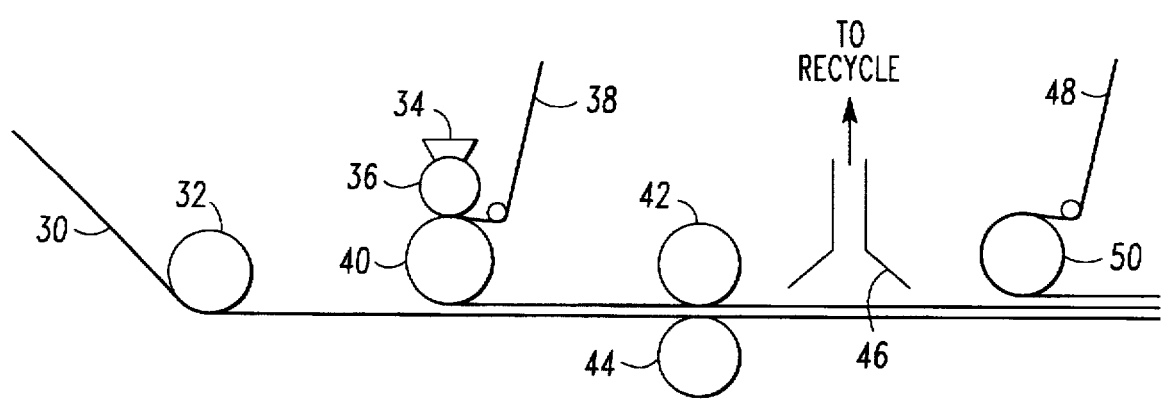
FIG.2

FIG.8
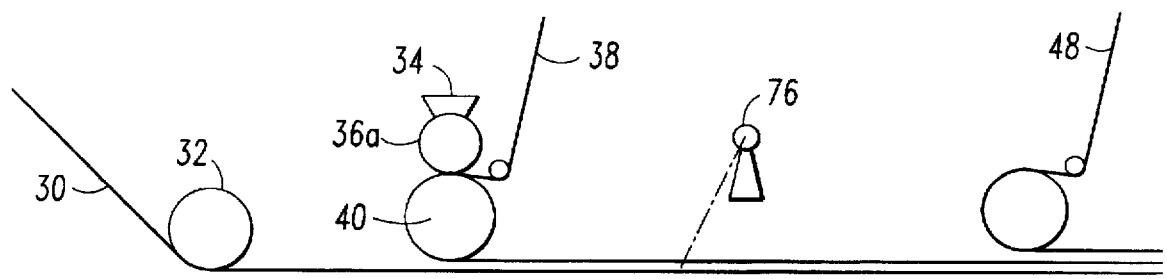
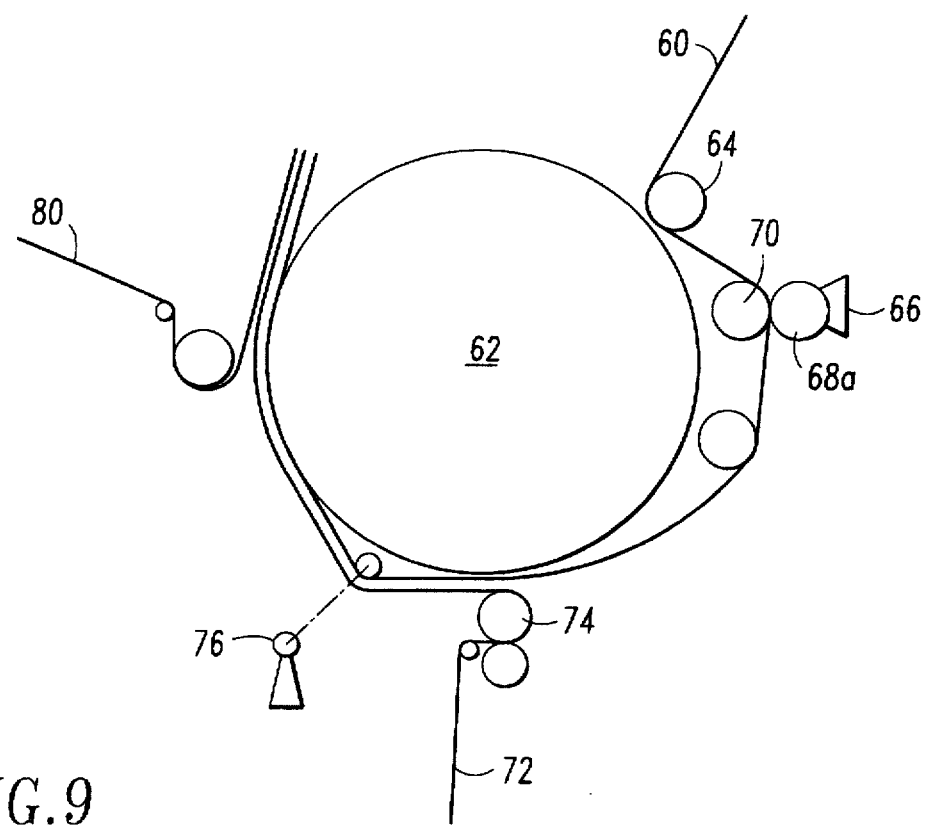
FIG.9

FIG.10
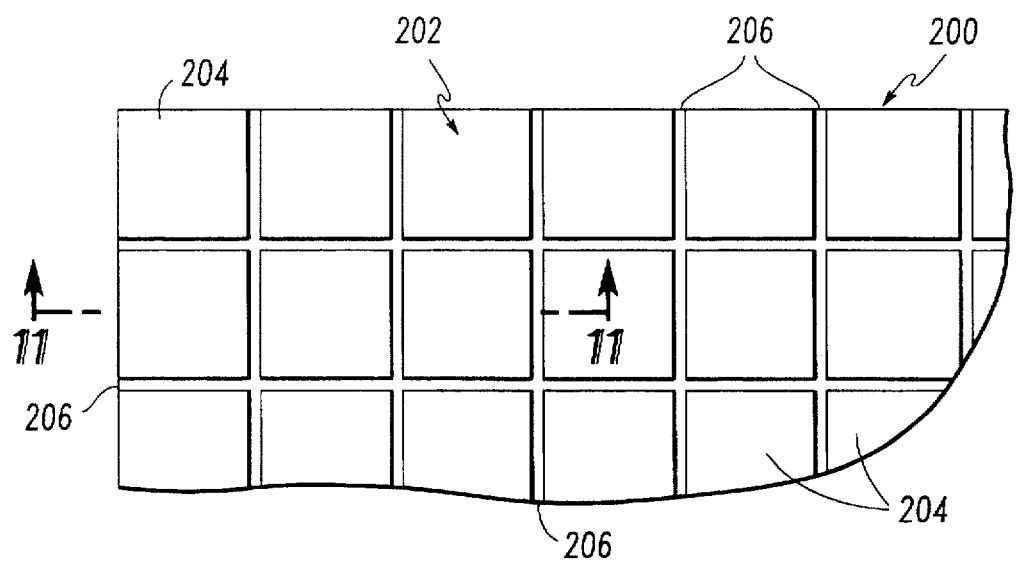
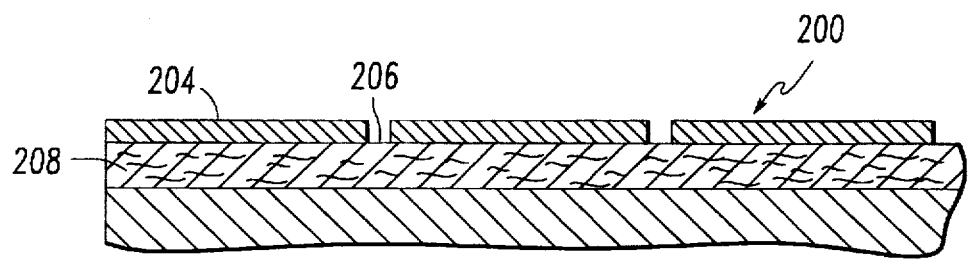
FIG.11
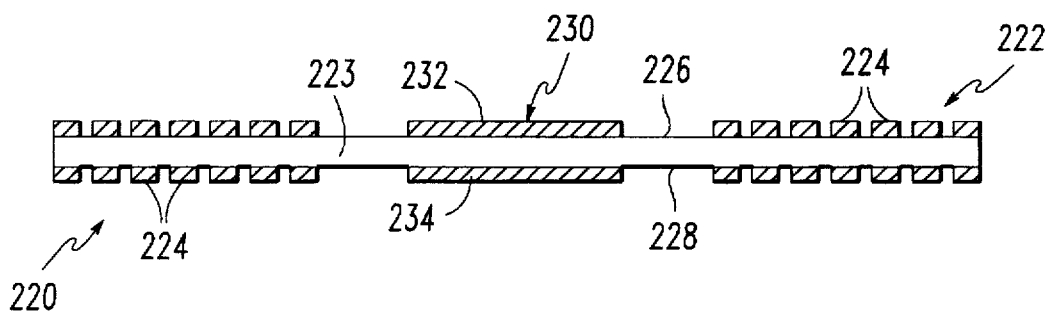
FIG.18

PATTERNED METAL FOIL LAMINATE AND METHOD FOR MAKING SAME

CROSS REFERENCE TO RELATED APPLICATIONS

This application is a continuation-in-part of application Ser. No. 08/602,576, filed Feb. 14, 1996, now U.S. Pat. No. 5,759,422.

BACKGROUND OF THE INVENTION

1. Field of the Invention

The present invention relates generally to metal foil-containing laminates and to methods of making such laminates, more specifically to metal foil/substrate laminates useful, among other applications, for forming into food containers especially suitable for packaging foods intended to be heated in a microwave oven and, more particularly, to patterned metal foil/substrate laminates and to methods of making such laminates.

2. Description of the Prior Art

The increasing popularity of microwave ovens for cooking all or a part of a meal has led to the development of a large variety of food products capable of being cooked in a microwave oven directly in the food packaging in which they are stored. The convenience of being able to cook food without removing it from the package appeals to a great many consumers. Unfortunately, however, currently available packaging for microwavable food products suffers from some significant disadvantages. A major disadvantage is the inability of the packaging to control the amount of microwave energy received by different areas of the food contained within the packaging. One particular problem is that the edges as well as the thinner areas of a food item become dried out and overcooked while the central or thicker areas may be barely cooked at all. Frozen food products, particularly relatively large volume items and, more particularly, food items which have a thick center section and thinner end sections, are illustrative of food products which are likely to cook unevenly in available freezer-to-microwave oven packaging. Likewise, frozen food products which consist of multiple different foodstuffs, each of which require different degrees of microwave heating, are food products in which some of the foodstuffs are likely to be overcooked while others are likely to be undercooked in available freezer-to-microwave packaging.

Metal foil, such as aluminum foil, in contrast to thin metallized coatings, reflects rather than transmits or absorbs microwave energy. Thus, instead of being partially or completely transparent to microwave energy, metal foil is opaque. This characteristic of metal foils and their use for microwave shielding has long been known and utilized in microwave food packaging. For example, U.S. Pat. No. 3,615,713 and U.S. Pat. No. 3,936,626 disclose microwave cooking apparatus comprising a tray having multiple and differently sized cutouts and a plurality of individual containers which are sized to be supported in the cutouts in the tray. Each container is designed to fully and properly cook the food product contained therewithin simultaneously with the food products in the other containers in order that a complete meal can be simultaneously prepared. The containers include varying amounts of aluminum foil for controlling the amount of microwave energy reaching each of the food products. For example, containers which are intended to contain food products which require little or no heating, such as ice cream, are formed of aluminum foil to fully shield the contents from microwave energy. Other containers are likewise formed of a microwave opaque material, such as aluminum foil, but have holes or openings formed therein to allow selected amounts of microwave radiation to penetrate the container and cook the food product therewithin within the prescribed time. The number and size of the holes is determined according to the normal cooking requirements of the food product within the container.

U.S. Pat. No. 4,351,997 discloses a food package comprising a tray including a bottom wall transparent to microwave radiation and a peripheral structure, including a peripheral wall and a peripheral rim extending outwardly from the peripheral wall at its top, wherein at least a portion of the peripheral structure incorporates a microwave opaque material, such as metallic foil, e.g., aluminum foil. The foil may advantageously be coated onto the peripheral wall substrate or laminated thereto. Food packages in which the metal foil is selectively located or patterned to shield selected portions of the tray from microwave energy contribute to uniform microwave cooking of the food product within the packages. The same beneficial result is achieved in U.S. Pat. No. 5,370,883 in which a microwave heating tray is disclosed including a cover having portions thereof formed of an aluminum foil laminate for shielding selected portions of the tray.

Metal foil which has been patterned by selectively removing predetermined areas thereof is currently made for microwave packaging applications by caustic demetallizing of the metal foil in the predetermined areas. For example, according to the methods disclosed in U.S. Pat. Nos. 4,552,614 and 5,340,436, polyester film is vacuum metallized or laminated to aluminum foil and then selectively printed or coated with a patterned mask of caustic-resistant material over the areas of the aluminum foil to be protected. Thereafter, the masked laminate is sprayed with caustic or passed through a caustic bath wherein the unmasked areas of the aluminum foil are selectively removed by chemical reaction with the caustic. The resulting patterned foil/film laminate may be further laminated to a paper or paperboard substrate in conventional manner. However, the demetallizing process is slow, cumbersome and uneconomically costly. Equally important is that the chemical reaction generates hydrogen, which is difficult to deal with, and creates the need for aluminum recovery from the caustic bath.

Other methods for producing patterned metal foil for microwave packaging applications which have been proposed are likewise unsatisfactory for reasons peculiar to the proposed methods or because they are economically unattractive. Efforts up to this time, therefore, have failed to provide a commercially practical and economically attractive method for making a patterned metal foil laminate which, among other uses, is a particularly effective food packaging material for the selective microwave heating of a wide variety of food products.

SUMMARY OF THE INVENTION

It is therefore a primary object of the present invention to provide a method for making a patterned metal foil laminate which is especially useful as a microwave packaging for foods and which is commercially practical and economically attractive.

It is also an object of the present invention to provide a method for making a patterned metal foil laminate which is especially useful as electrical circuitry and which is commercially practical and economically attractive.

It is another object of the present invention to provide such a method that permits the forming of a wide variety of regular or irregular shaped patterns for selectively controlling the amount of microwave energy passing through the laminate and received by different foods or different areas of a food product within microwave packaging formed from the laminate.

It is still another object of the present invention to provide a method for making a patterned metal foil/substrate laminate wherein an adhesive is applied between the metal foil and the substrate in a predetermined pattern corresponding to the desired metal foil pattern in the laminate.

It is yet another object of the present invention to provide a method for making a patterned metal foil/substrate laminate wherein an adhesive is applied between the metal foil and the substrate in selected areas in a predetermined pattern, the metal foil is cut in a pattern that corresponds to the boundaries of the adhesive-applied areas and the unadhered areas of metal foil are removed to provide a laminate wherein the metal foil pattern corresponds to the adhesive application pattern.

It is yet another object of the present invention to provide a method for making a patterned metal foil/substrate laminate wherein an adhesive is applied between the metal foil and the substrate in selected areas in a predetermined pattern and the metal foil is cut with a rotary die, without unacceptably cutting or degrading the substrate, in a pattern that corresponds to the boundaries of the adhesive-applied areas.

It is still another object of the present invention to provide a method for making a patterned metal foil/substrate laminate wherein an adhesive is applied between the metal foil and the substrate in selected areas in a predetermined pattern and the metal foil is cut with a laser beam, without unacceptably cutting or degrading the substrate, in a pattern that corresponds to the boundaries of the adhesive-applied areas.

It is another object of the present invention to provide a method for making a container for packaging food intended to be heated in a microwave oven according to which a patterned metal foil/substrate laminate is formed into a container wherein the foil-containing areas of the laminate form sections of the container which are opaque to microwave energy for preventing overcooking of the food products in those sections of the container and encouraging uniform cooking of the food.

It is still another object of the present invention to provide a patterned metal foil/substrate laminate for microwave packaging and other applications wherein the pattern is formed by laminating a sheet of metal foil to a substrate by applying an adhesive between the foil and substrate in selected areas in a predetermined pattern, cutting the metal foil, for example with a cutting tool such as a rotary die or a laser, in a pattern that corresponds to the boundaries of the adhesive-applied areas and removing the unadhered areas of metal foil to provide a laminate wherein the metal foil pattern corresponds to the adhesive application pattern.

It is yet another object of the present invention to provide a method for making a patterned metal foil/substrate laminate wherein an adhesive is applied between the metal foil and the substrate to form the laminate and the metal foil is irradiated with a laser beam in a predetermined pattern to vaporize the irradiated foil without unacceptably degrading the substrate.

It is another object of the present invention to provide a method for making a patterned metal foil/substrate laminate wherein the metal foil pattern comprises a plurality of islands separated by gaps, the method comprising the steps of applying an adhesive between the metal foil and the substrate to form the laminate and irradiating the metal foil with a laser beam in a predetermined pattern to vaporize the irradiated foil without unacceptably degrading the substrate.

The foregoing and other objects are achieved in accordance with the present invention by providing a method of forming a patterned metal foil/substrate laminate comprising the steps of laminating a sheet of metal foil to a substrate by applying an adhesive between the foil and the substrate in a predetermined pattern which defines areas where adhesive is present and areas where no adhesive is present; cutting the metal foil in a pattern which corresponds to the boundaries of the adhesive-containing areas; and, removing the areas of metal foil which are not adhesively adhered to the substrate. In one embodiment, the method includes the further step of laminating a sheet of barrier layer material, preferably polymer film, to the patterned metal foil layer of the patterned metal foil/substrate laminate. Preferably the metal foil is cut using a rotary die, desirably a machined rotary die, or a laser beam. Advantageously, the metal foil is unannealed aluminum foil, the substrate is paperboard and the polymer film is a polyester film. In another embodiment, the present invention provides a patterned metal foil/substrate laminate wherein the pattern is formed by laminating a sheet of metal foil to a substrate by applying an adhesive between the metal foil and substrate in selected areas in a predetermined pattern, cutting the metal foil in a pattern that corresponds to the boundaries of the adhesive-applied areas and removing the unadhered areas of metal foil, whereby the metal foil pattern corresponds to the adhesive application pattern. In yet another embodiment, the present invention provides a container for packaging food intended to be heated in a microwave oven and a method for making such a container according to which a patterned metal foil/substrate laminate is formed into a container wherein the foil-containing areas of the laminate form sections of the container which are opaque to microwave energy for preventing overcooking of foods in those sections of the container.

The objects are also achieved in accordance with another embodiment of the present invention by providing a method for making a patterned metal foil/substrate laminate including the steps of laminating a sheet of metal foil to a substrate by applying an adhesive between the foil and the substrate and irradiating the metal foil in a predetermined pattern with a laser beam to vaporize the irradiated areas of the metal foil. Advantageously, the metal foil is aluminum foil and the substrate is paper or paperboard. Depending upon the intended application for the laminate, the method may include the further the intended application for the laminate, the method may include the further step of laminating a sheet of barrier layer material, preferably polyester film, to the patterned metal foil layer of the patterned metal foil/substrate laminate.

BRIEF DESCRIPTION OF THE DRAWINGS

FIG. 1 is a diagrammatic representation of a laminate including a patterned metal foil formed in accordance with the present invention.

FIG. 2 is a schematic representation of a first method of making patterned metal foil laminates in accordance with the present invention.

FIG. 8 is a schematic representation of a third method of making patterned metal foil laminates in accordance with the present invention.

FIG. 9 is a schematic representation of a fourth method of making patterned metal foil laminates in accordance with the present invention.

FIG. 10 is a fragmentary top plan view of one form of the patterned metal foil laminate made in accordance with the present invention which comprises a plurality of metal foil islands separated by dielectric substrate gaps.

FIG. 11 is an enlarged sectional view taken along line 11—11 in FIG. 10.

FIG. 18 is a sectional view of a typical resonant circuit containing electronic surveillance tag made by a method of the present invention.

DESCRIPTION OF THE PREFERRED EMBODIMENT

Figure 3:
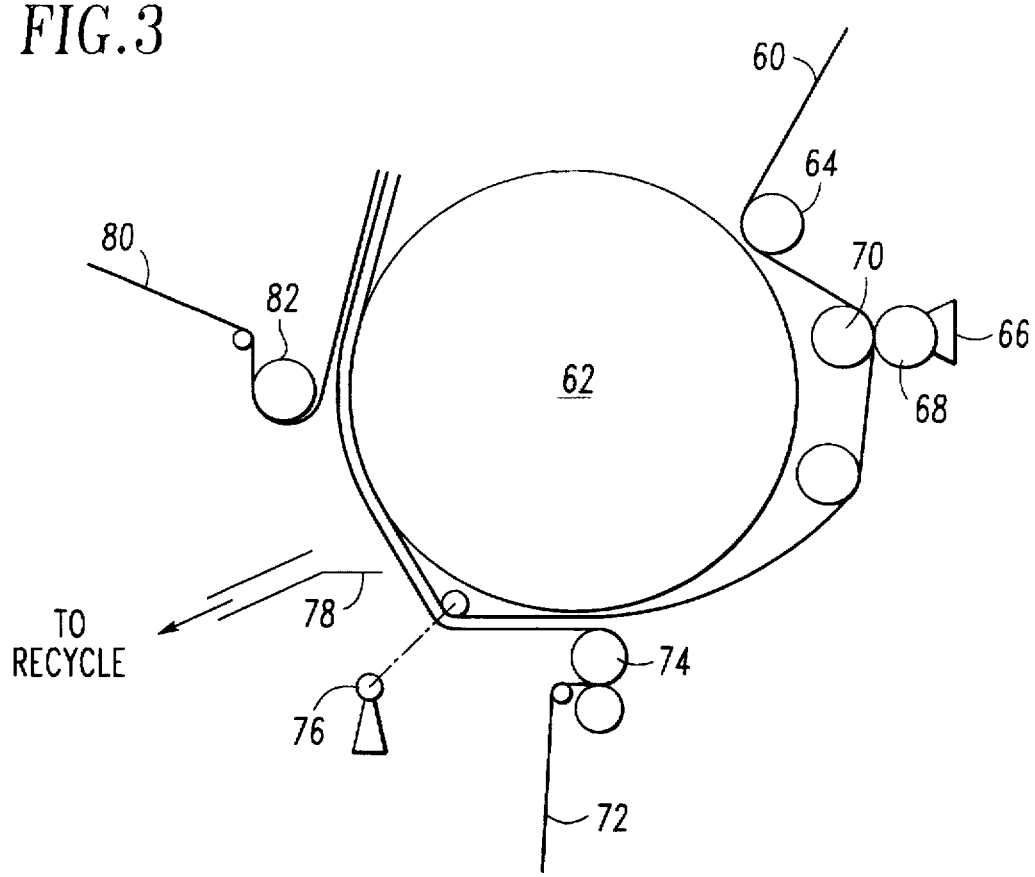
FIG. 3 is a schematic representation of a second method of making patterned metal foil laminates in accordance with the present invention.

Most commercially available packaging for food products intended to be cooked by microwave energy has the overall configuration of a three dimensional rectangular solid, the food product being contained within the walls. This configuration is easily formed from flat two dimensional blanks made of paperboard and the like, which can be folded or pressed to produce a three dimensional container of the desired size. Where the food product has a relatively large volume or pronounced thicker or thinner areas, the likely result of microwave cooking is that the edges and/or the thinner areas will be overcooked while the center and thicker areas will remain frozen or be barely cooked. To eliminate or at least reduce this undesirable effect, the blanks may include portions formed of a substrate/metal foil laminate to define microwave transparent areas and microwave opaque areas of the packaging which can be positioned proximate to selected foods or portions of foods within the container to selectively shield these foods from microwave energy.

The present invention provides metal foil/substrate laminates which are particularly useful for packaging foods intended for microwave heating and advantageous and economical methods of making such laminates. In accordance with one embodiment of the present invention, predetermined selected areas of the metal foil are removed, rendering those portions of the laminate transparent to microwave energy while the areas of the laminate where the metal foil is present remain opaque to microwave energy. By customizing the metal foil patterning to the heating requirements of the food product, a container can be formed from the laminate wherein the foil-containing containing areas of the laminate form sections of the container which are opaque to microwave energy for preventing overcooking of the food products in those sections of the container and encouraging uniform cooking of the food products. The metal foil patterns may be easily and conveniently customized to the food product and so shaped that undesirable heating areas in the food packaging are avoided. Moreover, the microwave energy heating activity may be selectively reduced in different portions of the container to heat various portions of a food product at different rates or to different degrees.

FIG. 1 illustrates a patterned metal foil/substrate laminate 10 having areas which contain metal foil and areas from which the metal foil has been removed which was made in accordance with the method of the present invention. The relative sizes of the layers shown are exaggerated for purposes of illustration. Laminate 10 includes a substrate 12, which may also function as one of the walls of the container comprising the food packaging. A metal foil layer 14 is adhered to substrate 12 and preferably positioned between the substrate and a barrier layer, such as a polymer film, 16 to which it is bonded. As will become apparent from the description which follows, laminate 10 may be formed by applying adhesive in a predetermined pattern onto a substrate 12, adhering a metal foil sheet 14 to the substrate 12, cutting the metal foil sheet 14 in a pattern corresponding to the pattern of the applied adhesive, removing the unadhered metal foil and, for some applications, laminating a polymer film 16 over the adhered metal foil 14 into contact with the substrate and the foil. In another embodiment of the invention, laminate 10 may be formed by applying adhesive onto a substrate 12, adhering a metal foil sheet 14 to the substrate 12, vaporizing metal foil in a predetermined pattern without damaging the substrate and, for some applications, laminating a polymer film 16 over the adhered metal foil 14 into contact with the substrate and the foil. Metal foil layer 14, shown in FIG. 1, represents the portion of the applied metal foil sheet which remains following cutting and removing the unadhered portions thereof or following removal of metal foil by laser vaporization.

The barrier layer 16 is preferably a heat tolerant and stable material which functions as a barrier to separate a food product in the container from the metal foil layer. The layer 16 must be microwave energy transparent and sufficiently stable at high temperatures when laminated to the metal foil so that it is suitable for contact with food at the temperatures reached while the food is being cooked in a microwave oven. Layer 16 may be formed from a wide variety of stable materials having barrier properties, such as polymeric film and paper, including polyesters, polyolefins, nylon, cellophane, paper and polysulfones. Polyester is the film material preferred for food containers because of its heat stability and surface smoothness. The thickness of the plastic film can preferably be about 0.0003 to 0.002 inches and, most desirably, about 0.0005 inches.

The metal foil 14 is preferably aluminum foil, but may be any well known, thin, laminatable, microwave opaque metal foil, such as an aluminum alloy foil. In a preferred embodiment of the invention the foil is a less malleable, i.e., more brittle, annealed or unannealed foil. An example of such an annealed foil is a relatively brittle aluminum alloy which is designed for diecutting. Such a foil is commercially available as Alumax 8145. However, particularly preferred for use is unannealed aluminum foil. Desirably, the foil utilized in the laminate of the present invention has a thickness in the range of 0.0002 to 0.002 inches and, more preferably, is relatively thin having a thickness in the range of 0.0002 to 0.0006 inches. The substrate 12 is preferably a flexible material which is transparent to microwave energy and which has a relatively high insulating capacity and a heat stability sufficient to withstand cooking temperatures in a microwave oven. Suitable substrate materials include paper, coated and uncoated paperboard, plastic films such as polyester films, and composite materials, such as fiber/polymer composites. For microwave applications, the preferred substrate materials are paper, coated and uncoated paperboard and polymer films.

The patterned metal foil/substrate laminate 10 is advantageously made in accordance with the present invention in accordance with the method which is schematically illustrated in FIG. 2 wherein adhesive is applied to the substrate-foil interface only in those areas of the laminate where microwave reflection is desired. Next, the foil is cut, without significantly defacing, cutting or otherwise damaging the substrate, in a pattern that corresponds to the boundaries of the adhesive applied areas. The areas of the foil which are not adhesively adhered to the substrate are removed and, desirably, sent to a clean recycle stream. As a final step, particularly for microwave food packaging applications, a barrier layer, such as a polymer film layer, may be applied over the patterned metal foil layer to act as a barrier between the metal foil/substrate laminate and the food product. The resulting laminate, comprising a substrate with patterned microwave reflecting foil areas adhesively laminated thereto, is particularly useful to form blanks for pressed or folded microwave trays and cartons.

Referring to FIG. 2, a sheet of substrate material 30, for example, paperboard, is fed around feed roll 32. Adhesive is distributed from an adhesive reservoir 34 onto a patterned gravure roll 36 which transfers the adhesive in the predetermined pattern of the roll onto a sheet of metal foil 38 as the foil passes over laminating roll 40 into laminating contact with substrate sheet 30. Alternatively, adhesive may be applied using a flexographic rubber roll which has a raised pattern formed thereon. The resulting metal foil/substrate laminate passes between a rotary die 42 and anvil 44 where the metal foil layer is cut in a pattern that corresponds to the boundaries of the adhesive-applied areas without significantly defacing or degrading the substrate. Metal foil which is not adhesively adhered to the substrate is vacuum stripped in vacuum trim collection station 46 and sent to a clean metal foil recycle station (not shown). The trim collection station, in one embodiment, comprises a combination rotating vacuum/pressure drum/vacuum hood or, simply, a vacuum hood, to remove the foil trim and scraps and blow the trim and scraps to a recycle station. Thereafter, a barrier layer, such as a thin polymer film layer, e.g., a polyester film, may be applied over the patterned metal foil. Various techniques may be used to coat or laminate the polymer film 48 onto the metal foil. For example, a polymer film having a heat sealable layer, such as amorphous polyester, on the surface thereof intended to contact the metal foil layer can be laminated to the foil layer by hot nip lamination. According to this technique, polymer film 48 passes over heated film laminating roll 50 to melt the heat sealable layer such that, when the melted layer is pressed into contact with the metal foil layer, the polymer film is heat sealed to the metal foil and substrate (in areas where the metal foil has been removed). Other well known laminating or coating techniques, such as dry mount adhesive lamination, extrusion lamination, lamination using a solventless adhesive and extrusion coating, can likewise be utilized in the method of the present invention.

Foil kiss rotary diecutting is one preferred method for cutting the foil in a pattern corresponding to the pattern of the applied adhesive. A problem encountered in diecutting aluminum foil/paperboard substrates is that aluminum foil is very malleable. It undergoes large out-of-plane shear strains without failing. In order to part the foil, a die has to penetrate deeply into the thick, soft board substrate. In the process, depending upon the die, the board may be unacceptably cut and damaged. In accordance with the present invention it has been found that machined rotary dies are the preferred cutting tool for diecutting aluminum foil. More particularly, machined rotary dies are typically sharp, even, precisely machined solid steel parts. Machined rotary dies are especially effective diecutting tools in that they are capable of clean, sharp, precise metal foil cutting without also cutting the underlying substrate. Rotary steel rule dies also produce satisfactory results in many applications. Serrated steel rule dies appear to produce superior results to straight steel rule dies. In addition, cutting is enhanced with steel rule dies when the substrate is corrugated paperboard, such as f-flute corrugated board, or when soft anvils are used during the diecutting. The soft anvil may be a conventional soft anvil, corrugated paperboard or the paperboard substrate which has been moisturized to provide the soft anvil.

Still better results are obtained where the metal foil is an unannealed aluminum foil. It is believed that the improved results observed with unannealed foils stems from the fact that such foils are more brittle and easier to die cut. For example, in one instance, particularly good results were obtained using a 0.0003 inch thick unannealed aluminum foil, commercially available as Alumax 1145 H19, laminated to a coated 18 pt. paperboard. No significant difference is noted when uncoated paperboard is substituted. When using unannealed metal foils, care should be exercised that lubricants used in the rolling of aluminum foil do not interfere with bonding the metal foil to the substrate. Unannealed foils still carry lubricating surface layers and these can interfere with bonding. Accordingly, surface lubricants on unannealed metal foil may be treated, e.g. by corona treatment or mild flame treatment sufficient to remove surface lubricants but insufficient to anneal the foil, to increase adhesion. Alternatively, special adhesives can be employed which form an effective bond even when the surface lubricants are present.

It will be appreciated that the laminating method described hereinabove can be practiced on various types of laminating equipment and all such equipment having the capability of performing the method of the present invention is contemplated for use in connection with the present invention. One suitable item of laminating equipment is a flexographic press with individual decks on which the various method steps can be performed. Another suitable item of laminating equipment utilizes a central impression drum, such as is shown schematically in FIG. 3.

The method which is schematically illustrated in FIG. 3 is substantially identical to the method schematically illustrated in FIG. 2 except that the pattern adhesive is applied to the substrate, rather than to the metal foil, prior to laminating the metal foil to the substrate and the metal foil is cut by a laser beam rather than by a rotary die. In the practice of the present invention, it is immaterial whether the adhesive is applied to the metal foil or the substrate. Specifically, with reference to FIG. 3, a sheet of substrate material 60 is fed between a central impression drum 62 and a feed roll 64. Adhesive is distributed from an adhesive reservoir 66 onto a patterned gravure roll 68 which transfers the adhesive in the predetermined pattern of the roll onto one face of the substrate sheet as it passes between support roll 70 and gravure roll 68. Alternatively, adhesive may be applied using a flexographic rubber roll which has the predetermined pattern formed thereon. A sheet of metal foil 72 is brought into laminating contact with the adhesive patterned substrate sheet as the metal foil sheet passes over laminating roll 74. The resulting metal foil/substrate laminate is moved past a laser cutting station 76 in which the metal foil is cut in a pattern that corresponds to the boundaries of the adhesive-applied areas without significantly defacing or degrading the substrate. It has been found that laser beam pattern cutting of metal foil is very precise and highly desirable, particularly where laser beam cutting is accomplished using a Nd:YAG laser. The laser can readily be adjusted for different patterns and different thickness metal foils merely by adjusting laser beam scan pattern and/or changing software. Laser beam cutting effectively burns away the metal foil while carefully preserving the substrate. In many applications, the advantages of laser beam cutting offset the cost disadvantage and the inconvenience that, for large patterns, laser beam cutting is slower than die cutting and the laminate production line must be slowed. Following cutting, foil which is not adhesively adhered to the substrate is vacuum stripped in vacuum trim collection station 78 and sent to a clean metal foil recycle station (not shown). Thereafter, a barrier layer, such as a thin polymer film layer, e.g., a polyester film, may be applied over the patterned metal foil. Various techniques may be used to coat or laminate the polymer film 80 onto the metal foil. For example, a polymer film having a heat sealable layer, e.g., an amorphous polyester layer, on the surface thereof intended to contact the metal foil can be passed over heated film laminating roll 82 to melt the heat sealable layer and pressed into contact with the metal foil to heat seal the polymer film to the metal foil and substrate by hot nip lamination. Alternatively, laminating or coating techniques such as dry mount adhesive lamination, extrusion lamination, lamination using a solventless adhesive and extrusion coating can be utilized.

The goal sought to be achieved by the method of the present invention, whatever materials and/or equipment may be selected, is the production of a laminate, like laminate 10 in FIG. 1, including a patterned metal foil 14 that will reflect microwave energy to prevent overcooking of the food in the container adjacent to the areas where the foil is present. In this manner, selected areas of reduced microwave heating activity, i.e., microwave reflective areas, can be positioned as required in a food package so that different areas of a food product can be heated at different rates and to different degrees.

Figure 4:
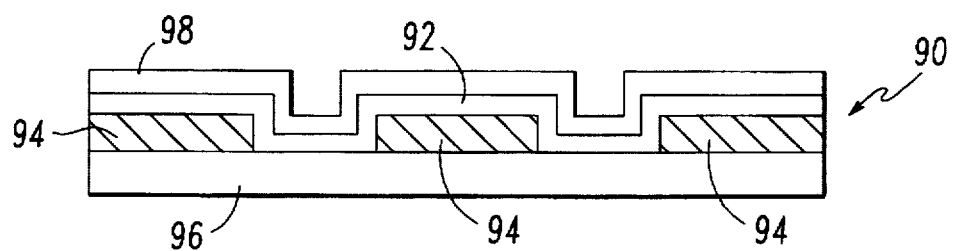
FIG. 4 is a diagrammatic representation of a laminate including a patterned metal foil formed in accordance with the present invention.

In another embodiment of the invention, the barrier layer polymer film can be metallized with a thin metal foil by conventional techniques, such as vacuum metallizing, prior to laminating the polymer film to the patterned metal foil layer. As can be seen in FIG. 4, laminate 90 includes metallized layer 92 positioned between the patterned metal foil layer 94/substrate 96 (in areas where the metal foil has been removed) and one surface of the barrier layer polymer film 98 and adhesively adhered to the patterned metal foil layer 94/substrate 96. The relative sizes of the layers shown are exaggerated for purposes of illustration. As is well known, metallized films having a surface conductivity of about 0.01 Mhos, on a microwave transparent substrate such as a polymer film, will absorb some of the microwave energy and convert it to thermal heating energy which can be used for browning and crisping food products adjacent to the metallized layer. Laminate 90 has substantially all of the attributes of laminate 10 in enhancing uniform microwave cooking of food products by selectively shielding portions of the food products. In addition, however, in those areas of the laminate 90 where the patterned metal foil layer 94 has been removed, laminate 90 has the attributes of a microwave interactive layer. It will be appreciated that, when laminate 90 is formed into a food package for microwave cooking, appropriate selection of a metal foil pattern and selective positioning of the patterned metal foil permits not only selective shielding but also selective browning and crisping of the food product within the food package.

Figure 5:
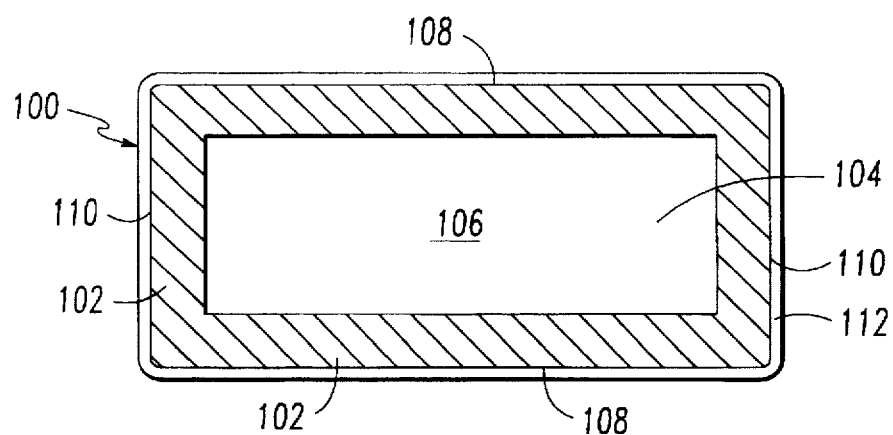
FIG. 5 is a plan view of a blank for a container for packaging food intended for heating in a microwave oven, including one illustrative embodiment of patterned microwave packaging in accordance with the present invention.

The representation of one embodiment of a patterned metal foil/substrate laminate in accordance with the present invention for packaging foods intended for microwave heating is shown in the tray blank 100 of FIG. 5. Tray blank 100 will ultimately be press formed to form a microwave heating container. The configuration of microwave reflective areas 102 and microwave transmissive areas 104 in the blank 100 is illustrative of an effective configuration for food products of a particular size, shape and dielectric constant. As can be seen, the portion of tray blank 100 which will form the bottom 106 when the blank 100 is press formed to form a tray contains no foil-containing areas. By contrast, the portion of tray blank 100 which will form the side panels 108, 110 when the blank 100 is press formed to form a tray comprise substantially entirely foil-containing areas. Peripheral tray lip 112 is entirely free of metal foil to assure that there is no arcing to the microwave oven walls. The patterning of the metal foil and the resulting selective positioning of the foil containing areas 102 avoids excessive microwave heating of the food product in these areas and encourages uniform cooking.

Figure 6:
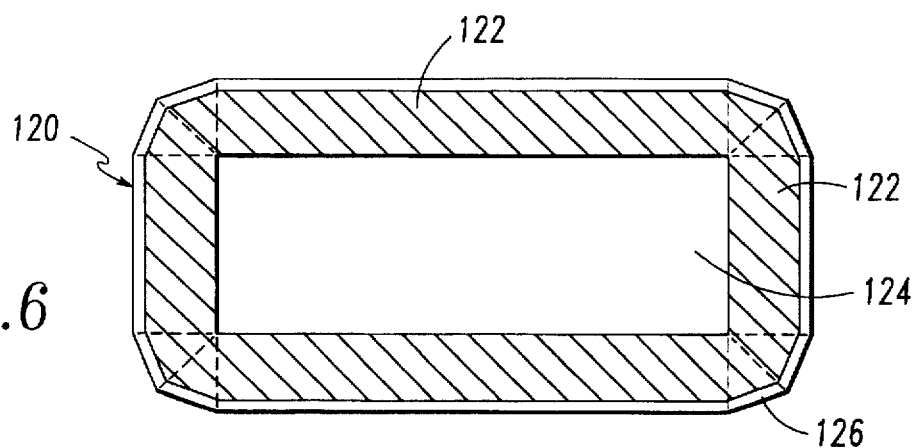
FIG. 6 is a plan view of another blank for a container for packaging food intended for heating in a microwave oven, including a second illustrative embodiment of patterned microwave packaging in accordance with the present invention.

FIG. 6 is an example of another tray blank 120 formed from the patterned metal foil/substrate laminate of the present invention. Tray blank 120 will ultimately be folded to form a microwave heating container. As with tray blank 100, blank 120 includes foil-containing areas 122, which will reflect microwave energy, and areas 124 where the foil has been removed in accordance with the method of the present invention, which will transmit microwave energy. Again, the peripheral tray lip 126 is entirely free of metal foil to assure that there is no arcing to the microwave oven walls. The resulting patterning and selective positioning of the foil containing areas 122 encourages uniform cooking of the food product.

Figure 7:
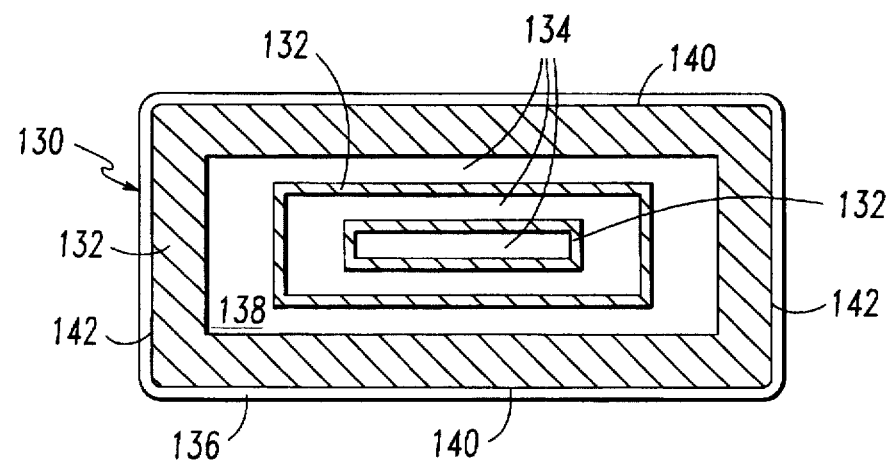
FIG. 7 is a plan view of still another blank for a container for packaging food intended for heating in a microwave oven, including a third illustrative embodiment of patterned microwave packaging in accordance with the present invention.

FIG. 7 is yet another example of a tray blank 130 formed from the patterned metal foil/substrate laminate of the present invention. Tray blank 130 will ultimately be press formed to form a microwave heating container. As with tray blanks 100 and 120, blank 130 includes foil-containing areas 132, which will reflect microwave energy, and areas 134 where the foil has been removed in accordance with the method of the present invention, which will transmit microwave energy. Again, the peripheral tray lip 136 is entirely free of metal foil to assure that there is no arcing to the microwave oven walls. The foil containing areas on what will form the bottom 138 when the blank 130 is press formed to form a tray include spaced, generally concentric rings. The portion of tray blank 130 which will form the side panels 140, 142 when the blank 130 is press formed comprise substantially entirely foil-containing areas. The resulting patterning and selective positioning of the foil containing areas 132 avoids overcooking of the food product in the foil-containing areas and encourages uniform cooking of the food product.

The types of patterns that may be employed for this purpose are essentially unlimited and may be varied as desired according to the microwave heating requirements of a particular food product. Ideally, to insure uniform cooking, each type of food product should be packaged in a container having a pattern of metal foil containing areas specifically designed for that type of food product. The present invention achieves this objective and facilitates the provision of patterned metal foil/substrate laminates specifically designed to produce the desired uniform cooking of a particular food product when that food product is heated in a microwave oven.

In accordance with yet another embodiment of the present invention, the patterned metal foil/substrate laminate 10 may be advantageously made in accordance with the methods which are schematically illustrated in FIGS. 8 and 9 wherein adhesive is applied to the substrate-foil interface to form the laminate, after which the foil is removed in selected areas, in a predetermined pattern, by vaporization with a laser. As in the previously described embodiments, particularly for microwave food packaging applications, a barrier layer, such as a polymer film layer, may be applied over the patterned metal foil layer to act as a barrier between the metal foil/substrate laminate and the food product. The resulting laminate, comprising a substrate with patterned microwave reflecting foil areas adhesively laminated thereto, is particularly useful to form blanks for pressed or folded microwave trays and cartons.

Referring to FIG. 8, a sheet of substrate material 30, for example, paperboard, is fed around feed roll 32. Adhesive is distributed from an adhesive reservoir 34 onto a distribution roll 36a which transfers the adhesive onto a sheet of metal foil 38 as the foil passes over laminating roll 40 into laminating contact with substrate sheet 30. The resulting metal foil/substrate laminate moves past a laser cutting station 76 in which the metal foil is irradiated in a predetermined pattern without significantly defacing or degrading the substrate. As described in connection with the embodiment of FIG. 3, irradiation is desirably accomplished using a Nd:YAG laser which is capable of ready adjustment for different patterns and different thickness metal foils. Thereafter, a barrier layer, such as a thin polymer film layer, e.g., a polyester film, may be applied over the patterned metal foil using any of the various techniques hereinbefore described to coat or laminate the polymer film 48 onto the metal foil.

Without intending to limit the various types of laminating equipment which may be used for performing the method of the present invention, another suitable item of laminating equipment utilizes a central impression drum, such as is shown schematically in FIG. 9. The method which is schematically illustrated in FIG. 9 is substantially identical to the method schematically illustrated in FIG. 8 except that the pattern adhesive is applied to the substrate, rather than to the metal foil. In the practice of the present invention, it is immaterial whether the adhesive is applied to the metal foil or the substrate. Specifically, with reference to FIG. 9, a sheet of substrate material 60 is fed between a central impression drum 62 and a feed roll 64. Adhesive is distributed from an adhesive reservoir 66 onto a distribution roll 68a which transfers the adhesive onto one face of the substrate sheet as it passes between support roll 70 and distribution roll 68a. A sheet of metal foil 72 is brought into laminating contact with the adhesive bearing substrate sheet as the metal foil sheet passes over laminating roll 74. The resulting metal foil/substrate laminate is moved past a laser cutting station 76 in which the metal foil is irradiated in a predetermined pattern without significantly defacing or degrading the substrate. Thereafter, a barrier layer 80, such as a thin polymer film layer, e.g., a polyester film, may be applied over the patterned metal foil using one of the various techniques hereinbefore described.

Whether kiss diecutting or laser cutting is utilized, whether the adhesive is applied in a predetermined pattern or not, an important objective of this invention is to provide a method for manufacturing inexpensive food packages that improve cooking uniformity in a microwave oven. This is accomplished by providing a package that is microwave opaque in some regions and microwave transparent in other regions. In this way, different areas of a food product can be heated at different rates and to different degrees.

In one particularly advantageous form of the invention, a patterned metal foil/substrate laminate in accordance with the present invention for packaging foods intended for microwave heating is formed with microwave transparent regions without the necessity for completely removing the metal foil in those regions demanding microwave transparency. Rather, with reference to FIGS. 10 and 11, the metal foil 202 of laminate 200 is diced into a plurality of conductive metal foil islands or patches 204 separated by gaps or strips 206. Desirably, the metal foil 202 is aluminum foil having a thickness in the range of 0.0002 to 0.002 inches and, more preferably, a thickness in the range of 0.0002 to 0.0006 inches. The substrate 208 is, most desirably, paper or coated or uncoated paperboard. The resulting array of conductive foil islands are electrically separated from each other. Notwithstanding that, owing to their thickness, the metallic islands are reflective and do not transmit microwave energy therethrough, it has been found that judicious selection of the gap and island dimensions will cause the normally reflective aluminum foil to become substantially transparent to microwave energy. The object of the island-gap pattern is to locally deactivate, i.e., to functionally eliminate, an aluminum foil layer that would ordinarily be a microwave shield without completely removing the aluminum foil. According to the present invention, reflection and fringe field heating is minimized and thermal heating and attendant crisping and browning are negligible. Stated otherwise, by selectively dicing the aluminum foil, a laminate can be made that preferentially passes microwave energy to hard-to-heat regions while maintaining shielding in easy-to-heat regions. This is significantly different than the gridding disclosed in U.S. Pat. No. 4,230,924—Brastad et al where the aluminum foil islands are intended to have a tangible influence on the food, i.e., to crispen or change the color of the food within the packaging.

In accordance with the present invention, a method is provided for making a patterned metal foil/substrate laminate for packaging foods intended for microwave heating which comprises laminating a sheet of metal foil to a substrate by applying an adhesive between said metal foils and said substrate and irradiating said metal foil with a laser beam in a predetermined pattern to form a plurality of individual conductive foil islands electrically separated by gaps of dielectric substrate material. The islands may have regular geometric shapes, such as squares, or may be irregularly shaped or patterned. It has been found that a properly adjusted scanning laser beam from an infrared Nd:YAG laser will vaporize the aluminum foil of the laminate without damaging the paper or paperboard substrate. By scanning the laser beam, for example, in a square pattern over the regions to be made microwave transparent, a plurality of square shaped conductive foil islands can be formed which are separated by relatively wide laser-made gaps of dielectric substrate material.

The grid dimensions (island center-to-center spacing (W) and gap width (w)) necessary for deactivation of aluminum foil depend on the dielectric constant of the food to be placed in the package and the proximity of the grid to the food. Grids may be defined in terms of a gridding intensity quantity, A, expressed as $Wln(2W/\pi w)$. It will be appreciated from this expression that grids with smaller A's are more finely diced, i.e., smaller W's, or have greater separation or gaps between islands, i.e., larger w's. The electric field is concentrated in the gaps between islands and there is a volume of high microwave field intensity which extends a distance approximately equal to the gap separation, w, perpendicular to the grid. The reflectivity of a grid depends strongly on the dielectric constant of the matter, such as food, in this high field intensity volume. When the dielectric constant in this high field intensity volume is large, the grid is more reflective. Transmission of microwave energy is greatest when the grid is separated from the food surface by a distance much greater than the gap separation w. In such a case, the dielectric constant in the high field intensity volume is small. The necessary gridding intensity, i.e., fineness or coarseness of grid, to transmit at least 90% of the energy which would have been transmitted in the absence of any grid, decreases as the food dielectric constant in the high field intensity volume decreases. Stated otherwise, it is easier to transparentize metal foil spaced away from high dielectric constant foods. Even well gridded foil near high dielectric constant foods reflects since the dielectric constant in the high field intensity volume is large. However, when the grid is immediately adjacent the food, the situation reverses. It is easier to transparentize metal foil near low dielectric constant foods.

Figure 12:
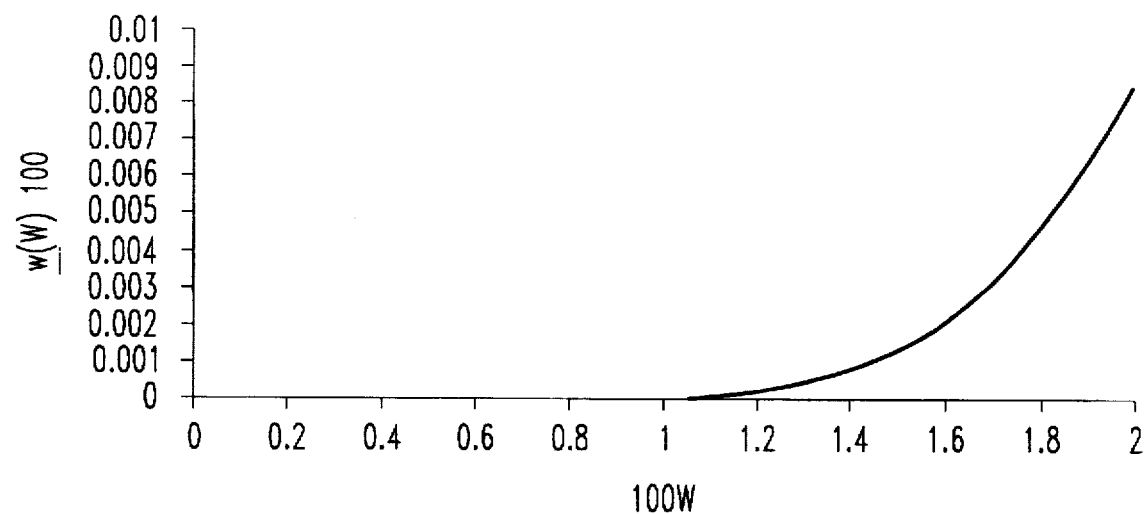
FIG. 12 is a graphical representation of the relationship between gap separation and island center-to-center spacing for water spaced more than the gap separation distance from an island grid.
Figure 13:
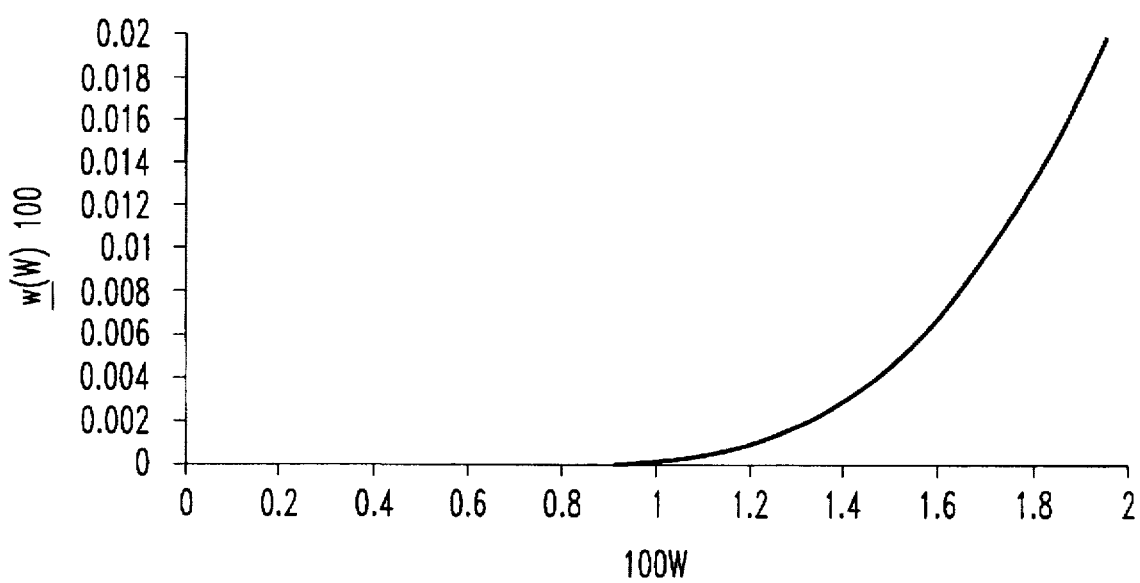
FIG. 13 is a graphical representation of the relationship between gap separation and island center-to-center spacing for meat spaced more than the gap separation distance from an island grid.
Figure 14:
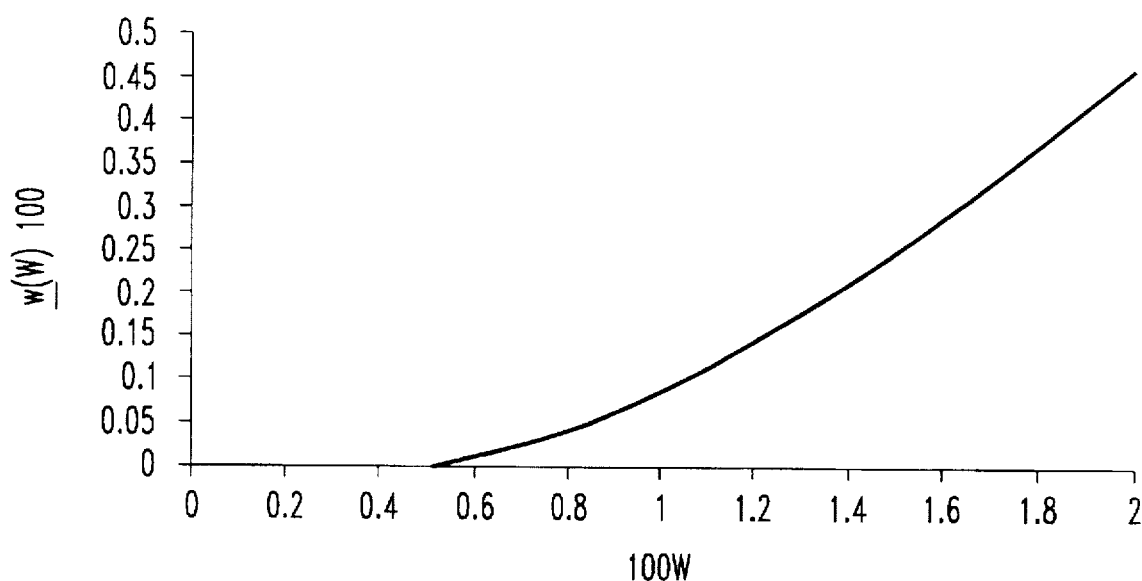
FIG. 14 is a graphical representation of the relationship between gap separation and island center-to-center spacing for bread spaced more than the gap separation distance from an island grid.
Figure 15:
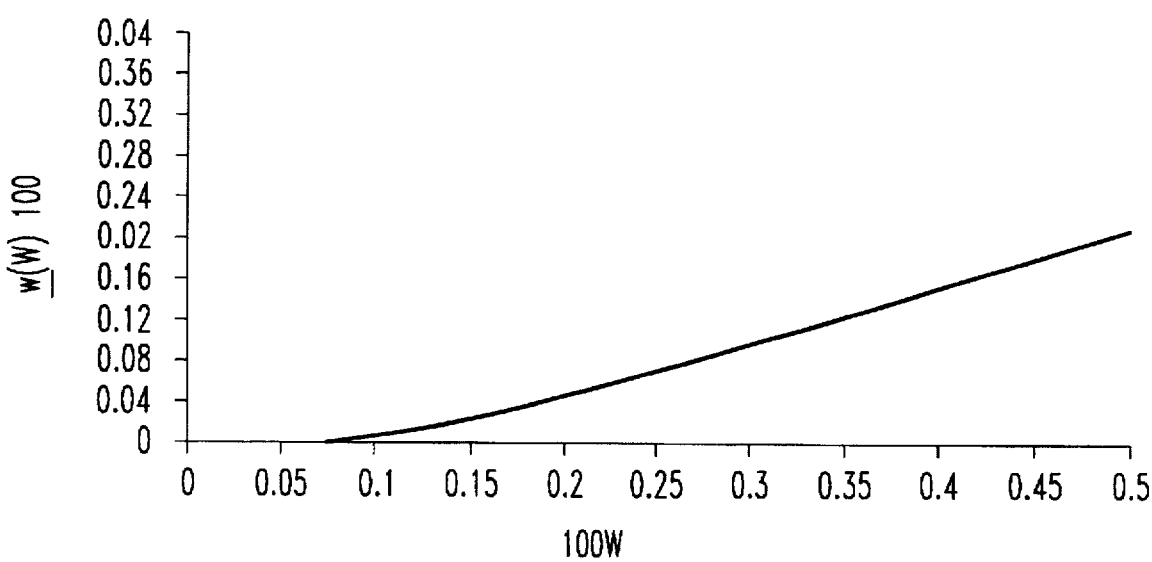
FIG. 15 is a graphical representation of the relationship between gap separation and island center-to-center spacing for water positioned adjacent an island grid.
Figure 16:
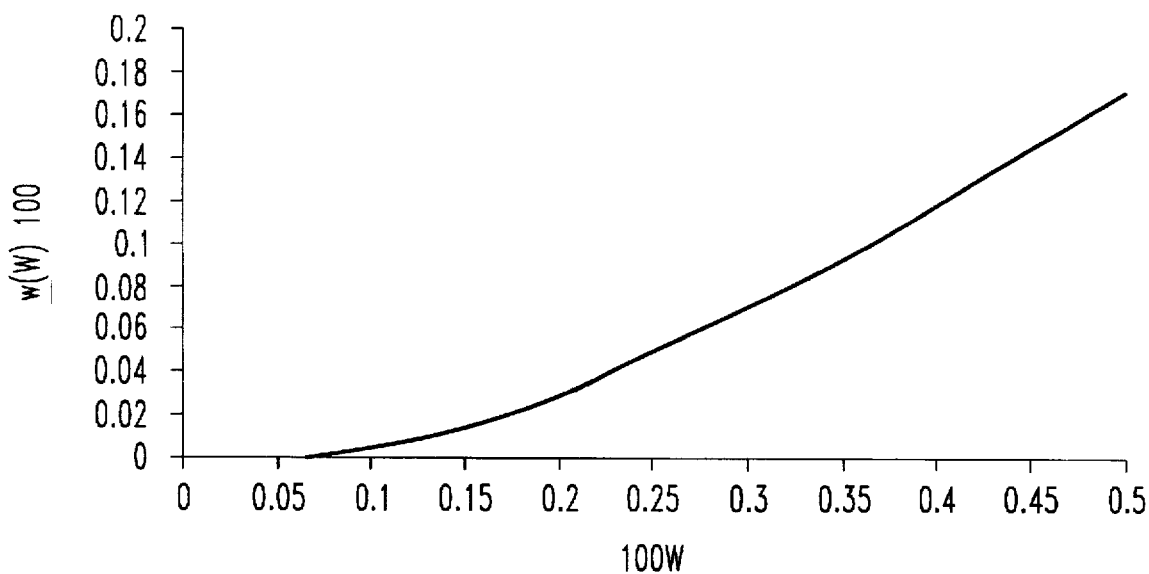
FIG. 16 is a graphical representation of the relationship between gap separation and island center-to-center spacing for meat positioned adjacent an island grid.
Figure 17:
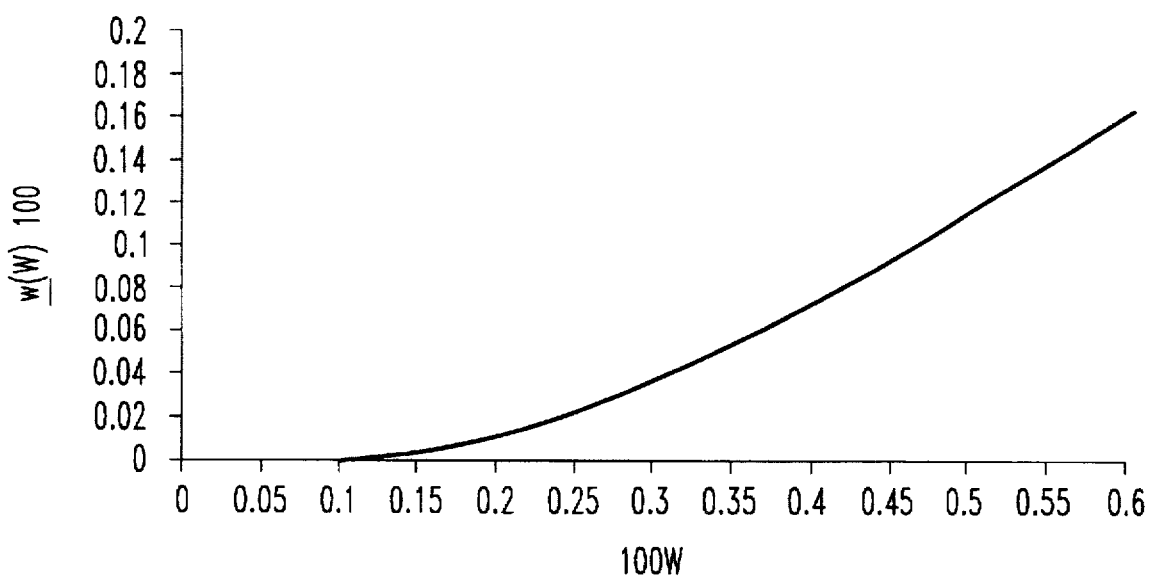
FIG. 17 is a graphical representation of the relationship between gap separation and island center-to-center spacing for bread positioned adjacent an island grid.

To illustrate the foregoing, reference is had to FIGS. 12–17 in each of which is plotted the values of w (island gap separation) in centimeters as a function of W (island center-to-center spacing) in centimeters necessary to achieve at least 90% of the energy transmission through the grid which would have been transmitted in the absence of any grid. FIGS. 12, 13 and 14 illustrate the relationship for three different foods, water, meat and bread, respectively, for the proximity condition where the food is positioned a distance greater than the gap separation, w, from the grid, i.e., outside of the high field intensity volume. FIGS. 15, 16 AND 17 illustrate the same relationship for the same foods, respectively, for the proximity condition where the food is positioned adjacent to the grid, i.e., within the high field intensity volume.

INDUSTRIAL APPLICABILITY

The patterned metal foil/substrate laminates of the present invention are primarily useful in the production of packaging for food products intended for heating in a microwave oven for assuring the uniform cooking of the food product. However, these laminates have non-microwave cooking applications as well, such as applications in which laminates having customizable metal foil patterning is desired. In particular, patterned metal foil/substrate laminates of the present invention have widespread applications in electronic circuitry, particularly where the laminates are formed using laser beams for cutting the pattern. Heretofore, conductive circuitry has been manufactured either chemically, e.g., by caustic etching, or using laser beams, e.g., by depositing a very thin film metal layer, such as a metallized layer, on the surface of an insulating substrate, irradiating the metallized layer with a laser in a predetermined pattern for removing the metal layer where irradiated and, thereafter, forming a thicker conductive metal layer onto the remaining metallized layer. This multi step procedure was necessitated by the inability to irradiate, with a laser beam, metal layers having a thickness sufficient to exhibit satisfactory conductivity in a circuit without using sufficient laser output power that the underlying synthetic resin substrate becomes irreparably damaged. It will be appreciated that both caustic etching and multi-deposition laser forming processes are time consuming, cumbersome and costly.

In accordance with the present invention, patterned metal foil/substrate laminates may be made and used for electrical circuitry by laminating a dielectric substrate to a metal foil layer and irradiating the foil layer with a laser beam in a predetermined pattern for removing the metal foil by vaporization where irradiated. If the circuit includes extended areas which are functionally non-conductive, rather than use a laser beam to vaporize the entire extended area, it has been found to be advantageous to dice the area by cutting it into a plurality of individual conductive foil islands separated by gaps of dielectric material. A laser beam can be used to accomplish the dicing, as is disclosed hereinbefore in connection with microwave packaging applications. Alternatively, in some applications, dicing can be accomplished by mechanically diecutting the gaps in the metal foil in accordance with the diecutting techniques hereinbefore disclosed.

As with microwave packaging applications for the laminates of the present invention, the metal foil utilized is preferably aluminum foil having a thickness in the range of 0.0002 to 0.002 inches, preferably 0.0002 to 0.0006 inches. The dielectric substrate is preferably a material, such as is hereinbefore disclosed in connection with microwave packaging applications, which has a relatively high insulating capacity. Most desirably, the substrate is selected from paper and coated and uncoated paperboard. The preferred laser is a Nd:YAG laser which can be readily adjusted for different patterns and different thickness metal foils.

One electronic circuitry application for the laminates and methods of the present invention which has great promise is the circuitry for electronic article surveillance tags and labels for theft prevention of retail merchandise. As is well known, these tags comprise inductive and capacitive elements arranged in series and supported on a dielectric substrate. The tags are typically used by attaching them to goods. When the customer presents the goods to pay for them, the tags are removed or deactivated. Typically, at each exit of a retail merchandise establishment using electronic surveillance tags on its merchandise, shoppers exiting the establishment are required to pass through radio-frequency transmitting and receiving units. When a surveillance tag 220 embodying circuitry made in accordance with the present invention is subjected to a radio-frequency signal at the resonant frequency of its resonant circuitry an electronic anti-shoplifting system is activated which sounds an alarm to indicate that an item of merchandise bearing an intact tag is being carried from an exit of the establishment.

Referring to FIG. 18 an electronic surveillance tag 220 is illustrated. Tag 220 comprises a patterned metal foil/substrate laminate 222 having areas which contain metal foil and areas from which the metal foil has been removed by laser beam vaporization. Laminate 222 includes a dielectric substrate 223, preferably formed of paper or paperboard, to which a spiral strip 224 is adhered on upper surface 226 and lower surface 228 of substrate 223. The spiral strip 224 functions as an inductor of the resonant circuit of tag 220. Connected in series with the inductive strip 224 is a capacitor 230 which is formed from two conductive plates 232 and 234 adhered, respectively, to upper surface 226 and lower surface 228. Not shown is a conductive connection through substrate 223 between spiral strip 224 and capacitor plate 234. Laminate 222 is formed by adhesively adhering metal foil sheets to opposite surfaces of the substrate 223 and cutting the metal foil sheets using a laser beam into the patterns required to establish spiral strip 224 and capacitor plates 232 and 234 on the substrate 223. Spiral strips 224 and capacitor plates 232 and 234, shown in FIG. 18, represent the portions of the applied metal foil sheets which remain following laser irradiation to vaporize the irradiated portions of the metal foil sheets.

We claim:

1. A method of forming a patterned metal foil/substrate laminate comprising the steps of:
   (a) laminating a sheet of metal foil to a substrate by applying an adhesive between said metal foil and said substrate; and
   (b) irradiating said metal foil with a laser beam in a pattern for removing by vaporization the irradiated areas of the metal foil.

2. A method as claimed in claim 1 including the further step of laminating a sheet of barrier layer material to the patterned metal foil layer of said laminate.

3. A method as claimed in claim 2 wherein said barrier layer material is a polymer film.

4. A method as claimed in claim 3 wherein the polymer film is a polyester film.

5. A method as claimed in claims 3 or 4 wherein said polymer film is metallized on one surface thereof and said metallized surface is adhesively adhered to said patterned metal foil layer.

6. A method as claimed in claim 2 wherein said sheet of barrier layer material is laminated to the patterned metal foil layer of said laminate by hot nip lamination.

7. A method as claimed in claim 2 wherein said sheet of barrier layer material is laminated to the patterned metal foil layer of said laminate by extrusion lamination.

8. A method as claimed in claim 2 wherein said sheet of barrier layer material is laminated to the patterned metal foil layer of said laminate by applying a layer of solventless adhesive to said film prior to lamination.

9. A method as claimed in claim 2 wherein said sheet of barrier layer material is laminated to the patterned metal foil layer of said laminate by dry mount adhesive lamination.

10. A method as claimed in claim 2 wherein said sheet of barrier layer material is extrusion coated onto the patterned metal layer of said laminate.

11. A method as claimed in claims 1 or 2 wherein said step of laser beam irradiation is accomplished using a Nd:YAG laser.

12. A method as claimed in claims 1 or 2 wherein said substrate is selected from the group consisting of paper, coated paperboard and uncoated paperboard.

13. A method as claimed in claim 12 wherein said metal foil is aluminum foil.

14. A method as claimed in claim 12 wherein said metal foil has a thickness in the range of 0.0002 to 0.002 inches.

15. A method as claimed in claim 14 wherein said metal foil has a thickness in the range of 0.0002 to 0.0006 inches.

16. A method as claimed in claim 13 wherein said metal foil has a thickness in the range of 0.0002 to 0.002 inches.

17. A method as claimed in claim 16 wherein said metal foil has a thickness in the range of 0.0002 to 0.0006 inches.

18. A method as claimed in claim 13 wherein said metal foil is unannealed aluminum foil.

19. A method as claimed in claim 18 including the step of corona treating the surface of said unannealed aluminum foil prior to laminating said aluminum foil to said substrate.

20. A method as claimed in claim 18 including the step of mild flame treating the surface of said unannealed aluminum foil prior to laminating said aluminum foil to said substrate.

21. A method as claimed in claims 1 or 2 wherein the pattern is a plurality of conductive islands separated by gaps.

22. A method as claimed in claim 1 wherein the pattern is an electrical circuit.

23. A method of forming a container for packaging food intended for heating in a microwave oven, the container having at least one section that is opaque to microwave energy for shielding food adjacent to the opaque section, and at least one section that is substantially transparent to microwave energy, said method comprising the steps of:
   (a) laminating a sheet of metal foil to a substrate by applying an adhesive between said metal foil and said substrate;
   (b) irradiating said metal foil with a laser beam in a pattern for removing by vaporization the irradiated areas of the metal foil;
   (c) laminating a sheet of barrier layer material to the patterned metal foil layer; and
   (d) forming said barrier layer/patterned metal foil/substrate laminate into said container with said barrier layer adjacent to the food in the container, the areas of the laminate from which metal foil was removed forming the sections of the container that are substantially transparent to microwave energy and the foil-containing areas of the laminate forming the sections of the container that are opaque to microwave radiation.

24. A method as claimed in claim 23 wherein said metal foil is aluminum foil, said substrate is selected from the group consisting of paper, coated paperboard and uncoated paperboard and said barrier layer material is polymer film.

25. A method as claimed in claim 24 wherein said metal foil has a thickness in the range of 0.0002 to 0.002 inches.

26. A method as claimed in claim 24 wherein said metal foil has a thickness in the range of 0.0002 to 0.0006 inches.

27. A method as claimed in claim 24 wherein said metal foil is unannealed aluminum foil.

28. A method as claimed in claim 27 including the step of corona treating the surface of said unannealed aluminum foil prior to laminating said aluminum foil to said substrate.

29. A method as claimed in claim 27 including the step of mild flame treating the surface of said unannealed aluminum foil prior to laminating said aluminum foil to said substrate.

30. A method as claimed in claim 23 wherein said barrier layer material is polymer film, said polymer film is metallized on one surface thereof and said metallized surface is adhesively adhered to said patterned metal foil layer.

31. A method as claimed in claims 23 or 24 wherein the pattern is a plurality of conductive islands separated by gaps.

32. A patterned metal foil/substrate laminate wherein said pattern is formed by laminating a sheet of metal foil to a substrate by applying an adhesive between said metal foil and said substrate and irradiating said metal foil with a laser beam in a pattern for removing by vaporization the irradiated areas of the metal foil.

33. A patterned metal foil/substrate laminate as claimed in claim 32 further including a sheet of barrier layer material laminated to the patterned metal foil layer.

34. A patterned metal foil/substrate laminate as claimed in claim 33 wherein said barrier layer material is polymer film.

35. A patterned metal foil/substrate laminate as claimed in claims 32, 33 or 34 wherein said metal foil is aluminum foil and said substrate is selected from the group consisting of paper, coated paperboard and uncoated paperboard.

36. A method as claimed in claim 35 wherein said metal foil has a thickness in the range of 0.0002 to 0.002 inches.

37. A method as claimed in claim 35 wherein said metal foil has a thickness in the range of 0.0002 to 0.0006 inches.

38. A patterned metal foil/substrate laminate as claimed in claim 35 wherein said metal foil is unannealed aluminum foil.

39. A patterned metal foil/substrate laminate as claimed in claim 34 wherein said polymer film is metallized on one surface thereof and said metallized surface is adhesively adhered to said patterned metal foil layer.

40. A method as claimed in claims 32 or 33 wherein the pattern is a plurality of conductive islands separated by gaps.

41. A container for packaging food intended for heating in a microwave oven, said container having at least one section that is opaque to microwave energy for shielding food adjacent to the opaque section, and at least one section that is substantially transparent to microwave energy, said container formed from a barrier layer/patterned metal foil/substrate laminate with said barrier layer adjacent to the food in the container, wherein said barrier layer/patterned metal foil/substrate laminate is formed by laminating a sheet of metal foil to a substrate by applying an adhesive between said metal foil and said substrate, irradiating said metal foil with a laser beam in a pattern for removing by vaporization the irradiated areas of the metal foil and laminating a sheet of barrier layer material to the patterned metal foil layer, whereby the areas of the laminate from which metal foil was removed form the sections of the container that are substantially transparent to microwave energy and the foil-containing areas of the laminate form the sections of the container that are opaque to microwave radiation.

42. A container as claimed in claim 41 wherein said metal foil is aluminum foil, said substrate is selected from the group consisting of paper, coated paperboard and uncoated paperboard and said barrier layer material is polymer film.

43. A container as claimed in claim 42 wherein said metal foil has a thickness in the range of 0.0002 to 0.002 inches.

44. A container as claimed in claim 42 wherein said metal foil has a thickness in the range of 0.0002 to 0.0006 inches.

45. A container as claimed in claim 42 wherein said metal foil is unannealed aluminum foil.

46. A container as claimed in claim 41 wherein said barrier layer material is polymer film, said polymer film is metallized on one surface thereof and said metallized surface is adhesively adhered to said patterned metal foil layer.

47. A container as claimed in claims 41 or 42 wherein the pattern is a plurality of conductive islands separated by gaps.

48. An electronic surveillance tag for merchandise for initiating an alarm in the event tagged merchandise is removed from a merchandise establishment, said tag comprising a resonant circuit tuned to a given radio frequency for producing a detectable resonant condition for triggering an anti-shoplifting alarm, said resonant circuit formed from a patterned metal foil/substrate laminate, wherein said patterned metal foil/substrate laminate is formed by laminating a sheet of metal foil to a substrate by applying an adhesive between said metal foil and said substrate and irradiating said metal foil with a laser beam in a pattern for removing by vaporization the irradiated areas of the metal foil, whereby unirradiated areas of the laminate formed of metal foil comprise conductive circuit elements for forming the resonant circuit.

49. An electronic surveillance tag as claimed in claim 48 wherein said metal foil is aluminum foil and said substrate is selected from the group consisting of paper, coated paperboard and uncoated paperboard.

50. An electronic surveillance tag as claimed in claim 49 wherein said metal foil has a thickness in the range of 0.0002 to 0.002 inches.

51. An electronic surveillance tag as claimed in claim 49 wherein said metal foil has a thickness in the range of 0.0002 to 0.0006 inches.

52. An electronic surveillance tag as claimed in claim 48 wherein said metal foil is unannealed aluminum foil.

\* \* \* \* \*

UNITED STATES PATENT AND TRADEMARK OFFICE
CERTIFICATE OF CORRECTION

PATENT NO.   : 5,800,724
DATED        : Sep. 1, 1998
INVENTOR(S)  : Habeger et al.

It is certified that error appears in the above-identified patent and that said Letters Patent is hereby corrected as shown below:

Delete Drawing Sheet 5, and substitute therefor the Drawing Sheet consisting of Figs. 10, 11 and 18, as shown on the attached paper.

Column 4, line 47, delete "the method may include the further the intended application for the laminate".

Column 12, line 67, after "adhesive", add --207--.

Column 13, line 28, change "dependsstrongly" to --depends strongly--.

Signed and Sealed this

Twenty-fourth Day of August, 1999

*Attest:*

Q. TODD DICKINSON

*Attesting Officer*  *Acting Commissioner of Patents and Trademarks*